United States Patent
Aoki et al.

(10) Patent No.: US 10,325,839 B2
(45) Date of Patent: Jun. 18, 2019

(54) REDUCTION OF STRESS IN VIA STRUCTURE

(71) Applicant: INTERNATIONAL BUSINESS MACHINES CORPORATION, Armonk, NY (US)

(72) Inventors: Toyohiro Aoki, Kawasaki (JP); Takashi Hisada, Kawasaki (JP); Akihiro Horibe, Kawasaki (JP); Sayuri Hada, Kawasaki (JP); Eiji I. Nakamura, Kawasaki (JP); Kuniaki Sueoka, Kawasaki (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/480,750

(22) Filed: Apr. 6, 2017

(65) Prior Publication Data
US 2018/0294213 A1    Oct. 11, 2018

(51) Int. Cl.
*H01L 21/768* (2006.01)
*H01L 23/498* (2006.01)
*H01L 23/48* (2006.01)

(52) U.S. Cl.
CPC .. *H01L 23/49827* (2013.01); *H01L 21/76898* (2013.01); *H01L 23/481* (2013.01); *H01L 2224/11* (2013.01); *H01L 2224/14181* (2013.01); *H01L 2924/0002* (2013.01); *H01L 2924/00014* (2013.01)

(58) Field of Classification Search
CPC ......... H01L 21/76898; H01L 21/76829; H01L 21/76807; H01L 23/481; H01L 23/4982; H01L 23/5226
See application file for complete search history.

(56) References Cited

U.S. PATENT DOCUMENTS

| | | | |
|---|---|---|---|
| 5,244,143 A | * | 9/1993 | Ference ................ B23K 1/20 228/180.21 |
| 7,439,170 B1 | | 10/2008 | Daubenspeck et al. |
| 7,754,599 B2 | | 7/2010 | Hsu et al. |
| 7,859,122 B2 | | 12/2010 | Daubenspeck et al. |
| 8,614,512 B2 | | 12/2013 | Guerin et al. |

(Continued)

OTHER PUBLICATIONS

McCann, S. et al., "Prevention of Cracking From RDL Stress and Dicing Defects in Glass Substrates" IEEE Transactions on Device and Materials Reliability (Mar. 2016) pp. 43-49, vol. 16, No. 1.

(Continued)

*Primary Examiner* — Cuong Q Nguyen
(74) *Attorney, Agent, or Firm* — Tutunjian & Bitetto, P.C.; Vazken Alexanian

(57) ABSTRACT

A via structure for electric connection is disclosed. The via structure includes a substrate that has a first surface and a via hole opened to the first surface. The via structure includes also a stress buffer layer disposed on the first surface of the substrate, which has an opening aligned to the via hole of the substrate. The via structure further includes a conductive body formed in the via hole of the substrate at least up to the level of the first surface of the substrate. In the via structure, the stress buffer layer receives the conductive body extending into the opening over the level of the first surface of the substrate and/or covers, at least in part, the edge of the first surface around the via hole of the substrate.

18 Claims, 14 Drawing Sheets

(56) References Cited

U.S. PATENT DOCUMENTS

| | | | |
|---|---|---|---|
| 8,653,662 B2 | 2/2014 | LaCroix et al. | |
| 9,202,792 B2 | 12/2015 | Yu et al. | |
| 9,214,425 B2 | 12/2015 | Mohammed et al. | |
| 2005/0012217 A1* | 1/2005 | Mori | H01L 23/49822 257/758 |
| 2013/0334656 A1* | 12/2013 | Jin | H01L 23/5256 257/529 |
| 2014/0217559 A1* | 8/2014 | Choi | H01L 23/481 257/621 |
| 2018/0076129 A1* | 3/2018 | Cheng | H01L 23/5226 |

OTHER PUBLICATIONS

Zhang, X. et al., "Low-Stress Bond Pad Design for Low-Temperature Solder Interconnections on Through-Silicon vias (TSVs)" IEEE Transactions on Components, Packaging and Manufacturing Technology (Apr. 2011) pp. 510-518, vol. 1, No. 4.

\* cited by examiner

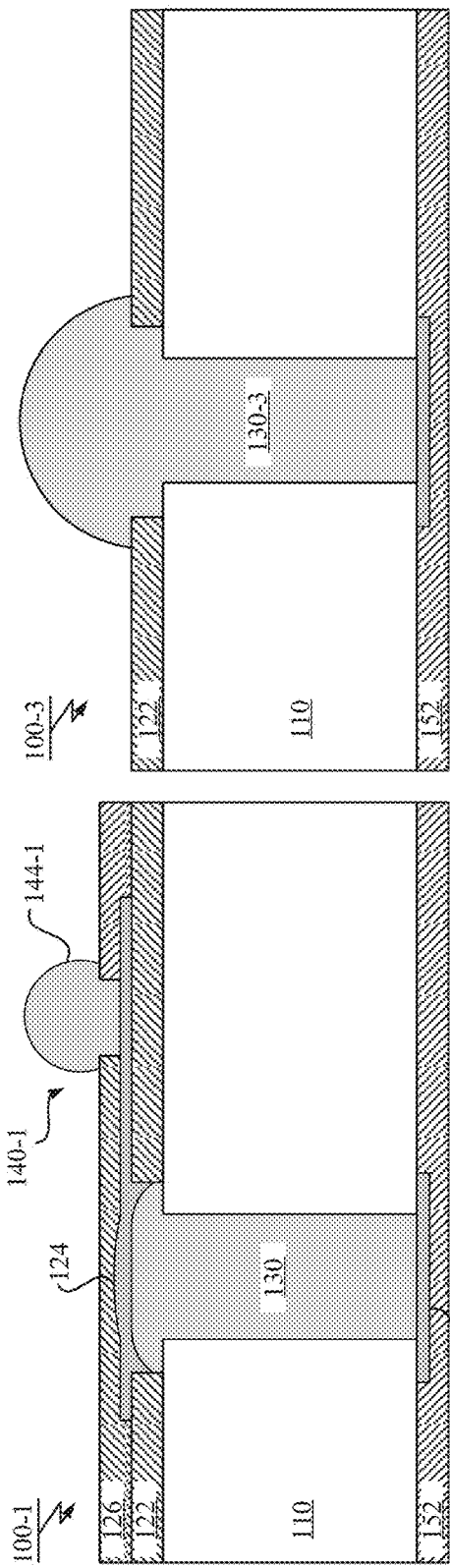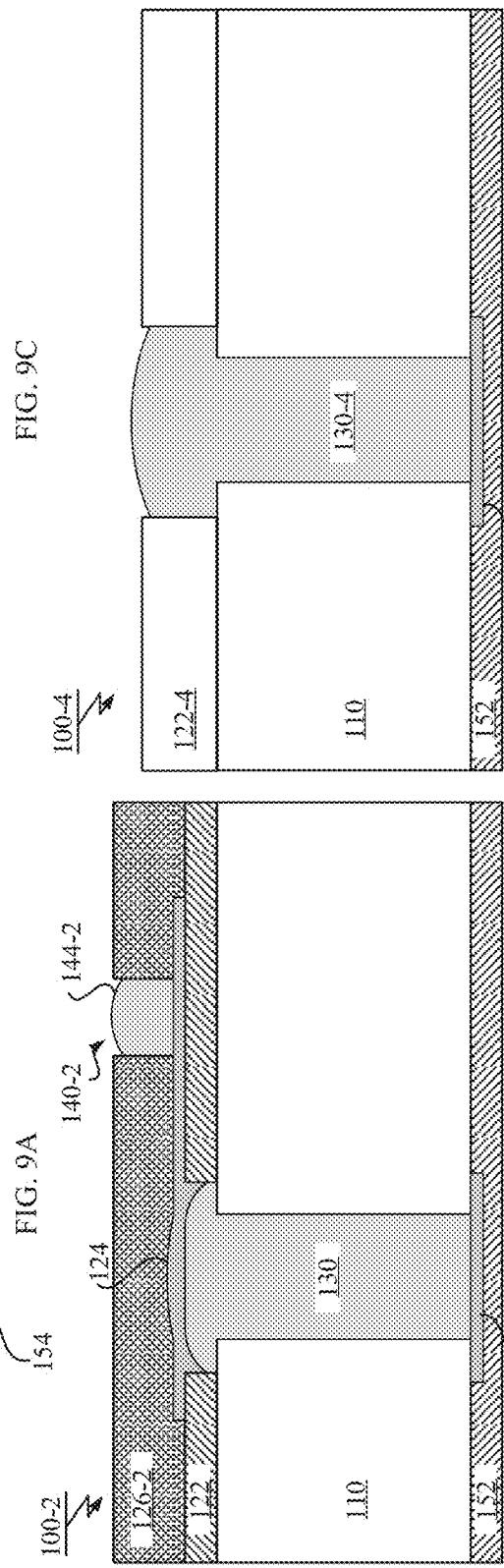

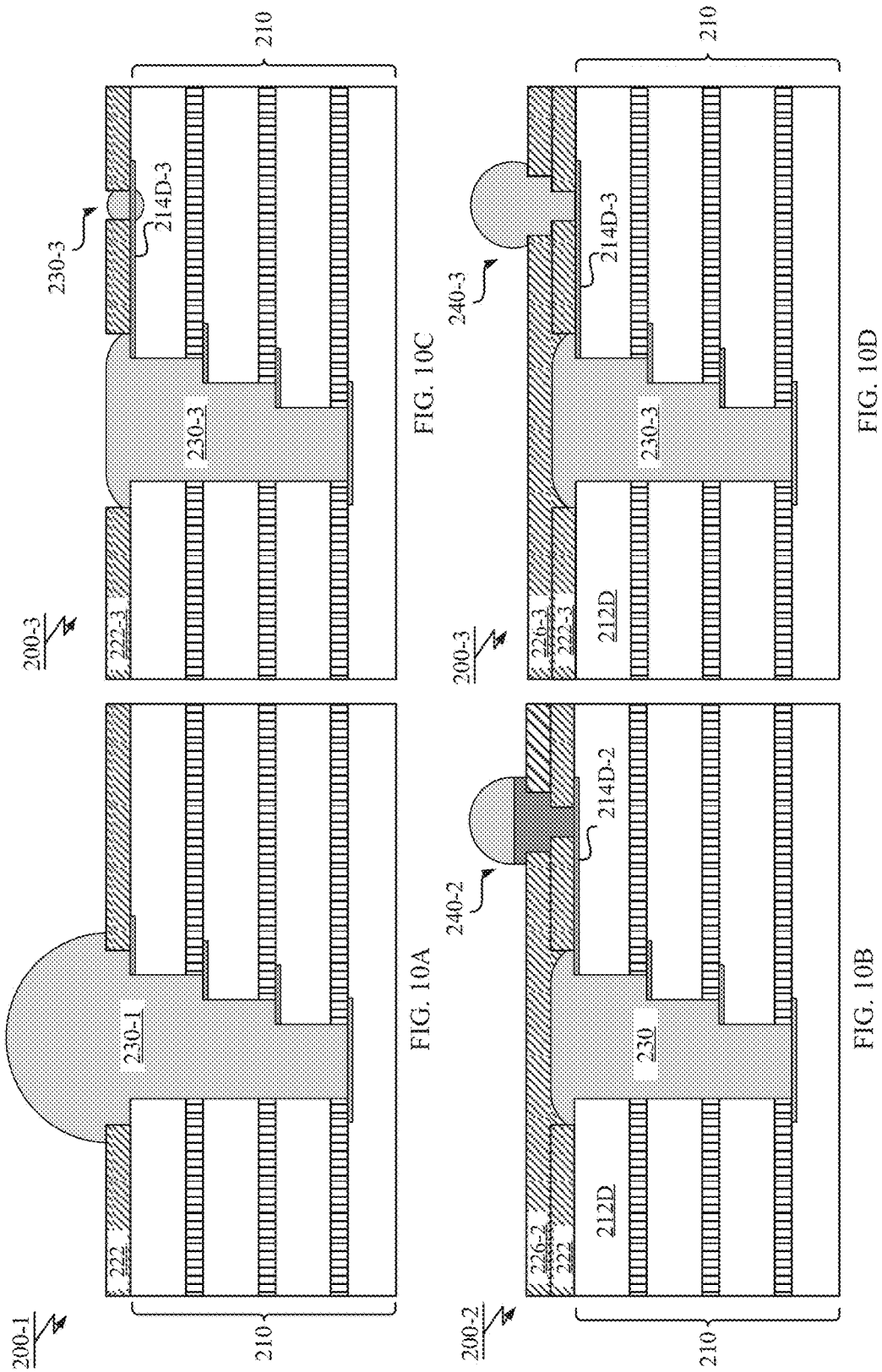

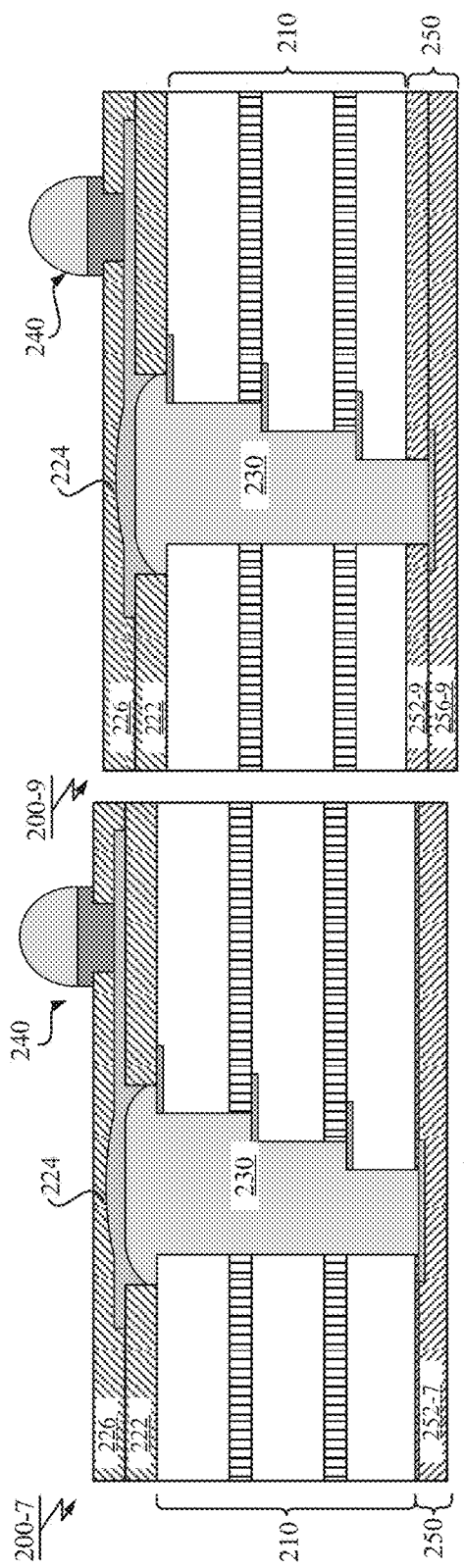
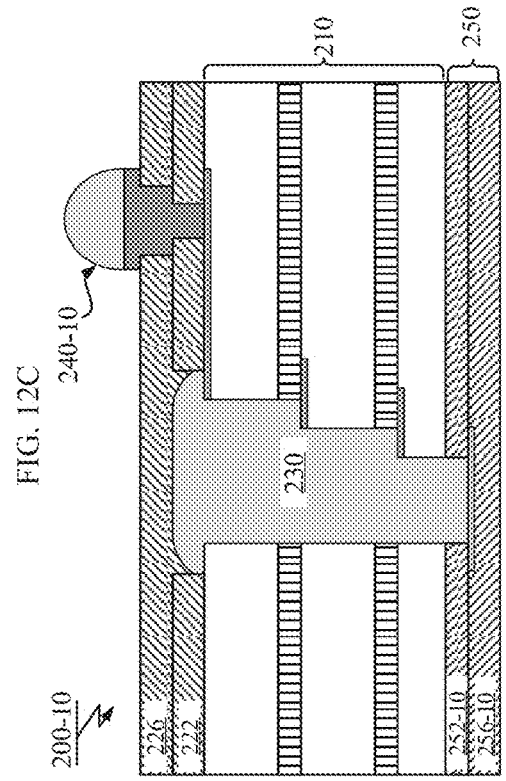
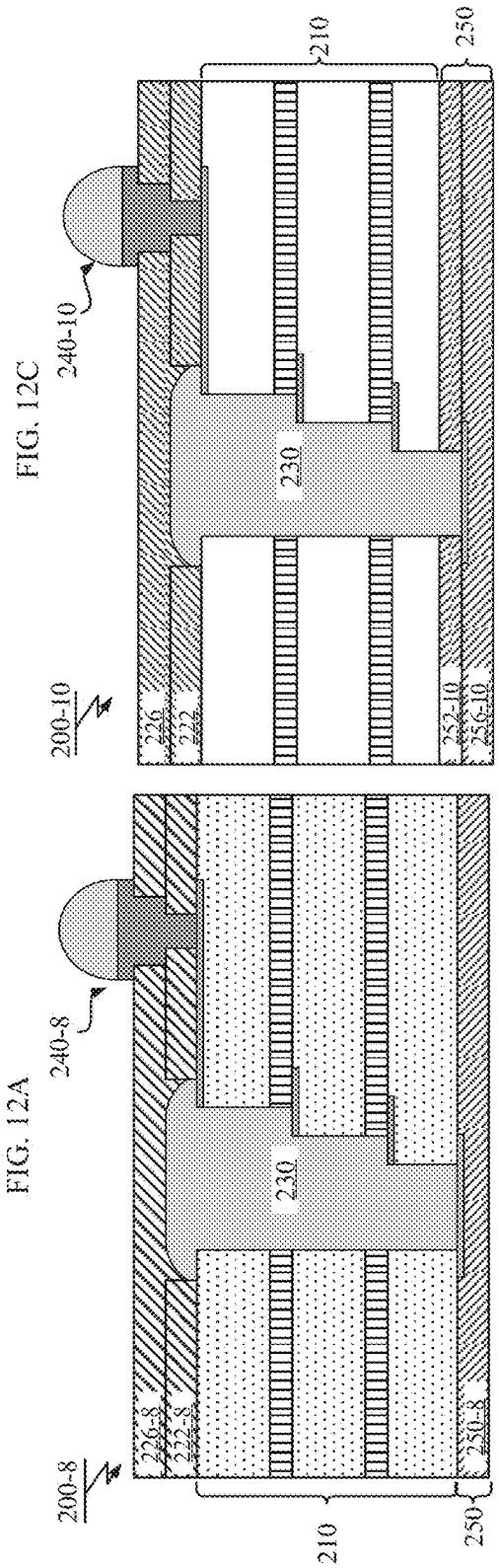

REDUCTION OF STRESS IN VIA STRUCTURE

BACKGROUND

Technical Field

The present invention, generally, relates to vertical electrical connections for 3D (three-dimensional) integration technology, more particularly, to via structures for electric connection and methods for fabricating thereof.

Related Art

In conventional through via structures such as TSV (Through Silicon Via) and TGV (Through Glass Via), both ends of the through via are typically surrounded by rigid materials such as Si, Metal or BEOL (Back End Of Line, SiO2), which may have a higher Young's modulus. Since the through via typically has a larger CTE (Coefficient of Thermal Expansion) than the substrate, mismatch between the though via and the substrate in the CTE may cause stress around the ends of the through via when a change in temperature occurs during a fabrication process, resulting in failure of electrical connections.

Recently, solder vias have been attracting attention since such via structures can be fabricated by IMS (Injection Molded Solder) technology, which provides low cost solutions for 3D integration. However, it is noted that solder has larger CTE (21.7 ppm for SAC (SnAgCu)) than that of Copper (16.2 ppm), which is still higher than typical substrate materials (2.6 ppm for silicon, ~3 ppm for glass). In the TGV, the solder via would pump up a rigid metal layer that covers the solder via, which results in cracks in the brittle glass substrate around the ends of the solder via.

In relation to the stress generated around the via structure, recently, low stress bond pad design has been proposed for solder interconnection on TSVs (X. Zhang et al., "Low-Stress Bond Pad Design for Low Temperature Solder Interconnections on Through-Silicon Vias (TSVs)", IEEE Transactions on Component, Packaging and Manufacturing Technology 1(4): 510-518. 2011). However, the proposed bound pad design is limited for solder interconnection formed on a pad located above TSVs, therefore, there still remains a need for improved via structures that are capable of reducing stress generated around the end of the via due to the mismatch between the via and the substrate in the CTE.

SUMMARY

According to an embodiment of the present invention, there is provided a via structure for electric connection. The via structure includes a substrate that has a first surface and a via hole opened to the first surface. The via structure also includes a stress buffer layer disposed on the first surface of the substrate, which has an opening aligned to the via hole of the substrate. The via structure further includes a conductive body formed in the via hole of the substrate at least up to the level of the first surface of the substrate. In the via structure, the stress buffer layer receives the conductive body extending into the opening over the level of the first surface of the substrate and/or covers, at least in part, the edge of the first surface around the via hole of the substrate.

In the via structure according to an embodiment of the present invention, rigid material other than the conductive body can be excluded from the first surface of the substrate around the via hole by the conductive body intruded into the stress buffer layer and/or the stress buffer layer itself, thereby reducing stress generated around the end of the conductive body formed in the via hole.

In another embodiment, the via structure further includes a wiring layer disposed on the stress buffer layer and the conductive body; and a polymer dielectric layer disposed over the metal material, which constitutes a redistribution layer on the substrate together with the stress buffer layer and the wiring layer. In the via structure according to one embodiment, since the wiring layer is separated from the first surface of the substrate by the conductive body and/or the stress buffer layer, stress affecting the substrate can be reduced, in comparison with that has wiring layer directly on the surface of the substrate.

In other preferable embodiments, the substrate has a second surface and the via hole is a through hole penetrating through the substrate from the first surface to the second surface. The via structure further includes a second stress buffer layer disposed on the second surface of the substrate, which has an opening aligned to the via hole of the substrate. In the via structure, the second stress buffer layer receives the conductive body extending into the opening over the level of the second surface of the substrate and/or covers, at least in part, the edge of the second surface around the via hole of the substrate. Stress generated around other end of the conductive body formed in the via hole and subsequent mechanical damage on the substrate can be reduced even if an aspect ratio of the via structure is relatively high.

According to other embodiments of the present invention, there is provided a method for fabricating a via structure. The method includes preparing a substrate that has a first surface. The method also includes fabricating a via hole in the substrate from the first surface. The method further includes disposing a stress buffer layer on the first surface of the substrate, which has an opening aligned to the via hole of the substrate. The method includes further filling the via hole with a conductive material at least up to the level of the first surface of the substrate. The stress buffer layer receives the conductive material extending into the opening over the level of the first surface of the substrate and/or covers, at least in part, the edge of the first surface around the via hole of the substrate.

In the via structure fabricated by the method according to the other embodiment of the present invention, rigid material other than the conductive material can be excluded from the first surface of the substrate around the via hole by the conductive material intruded into the stress buffer layer and/or the stress buffer layer itself, thereby reducing stress generated around the end of the conductive material filled in the via hole.

According to further embodiments of the present invention, there is provided a method for fabricating a via structure. The method includes preparing a substrate that has a first surface, a via hole opened to the first surface and a stress buffer layer disposed on the first surface, in which the stress buffer layer has an opening aligned to the via hole. The method further includes forming, in the via hole, a conductive body that has a protrusion part extending into the opening of the stress buffer layer over the level of the first surface of the substrate.

In the via structure fabricated by the method according to the further embodiment of the present invention, rigid material other than the conductive material can be excluded from the first surface of the substrate around the via hole by the conductive material intruded into the stress buffer layer, thereby reducing stress generated around the end of the conductive body formed in the via hole.

According to other embodiments of the present invention, there is provided a method for fabricating a via structure. The method includes preparing a substrate that has a first surface, a via hole opened to the first surface and a conductive material filled in the via hole. The method further includes disposing a stress buffer layer on the first surface of the substrate and the conductive material in part, which has an opening aligned to the via hole of the substrate and covers, at least in part, the edge of the first surface around the via hole of the substrate.

In the via structure fabricated by the method according to the other embodiment of the present invention, rigid material other than the conductive material can be excluded from the first surface of the substrate around the via hole by the stress buffer layer, thereby reducing stress generated around the end of the conductive material filled in the via hole.

According to another embodiment of the present invention there is provided an electronic apparatus, which has the aforementioned via structure.

In the electronic apparatus according to another embodiment of the present invention, stress generated around the end of the conductive material during a fabrication process can be reduced and reliability of electric connection in the electronic apparatus can be improved.

Additional features and advantages are realized through the techniques of the present invention. Other embodiments and aspects of the invention are described in detail herein and are considered a part of the claimed invention.

BRIEF DESCRIPTION OF THE DRAWINGS

The subject matter, which is regarded as the invention, is particularly pointed out and distinctly claimed in the claims at the conclusion of the specification. The forgoing and other features and advantages of the invention are apparent from the following detailed description taken in conjunction with the accompanying drawings in which:

FIGS. 9A, 9B, 9C and 9D illustrate cross-sectional views of variants of the through via structure according to one or more alternative embodiments of the present invention;

FIGS. 10A, 10B, 10C and 10D illustrate cross-sectional views of variants of the Vias structures according to one or more alternative embodiments of the present invention;

FIGS. 12A, 12B, 12C and 12D illustrates cross-sectional views of variants of the Vias structures according to one or more alternative embodiments of the present invention.

DETAILED DESCRIPTION

Now, the present invention will be described using particular embodiments, and the embodiments described hereafter are understood to be only referred to as examples and are not intended to limit the scope of the present invention.

Figure 1:
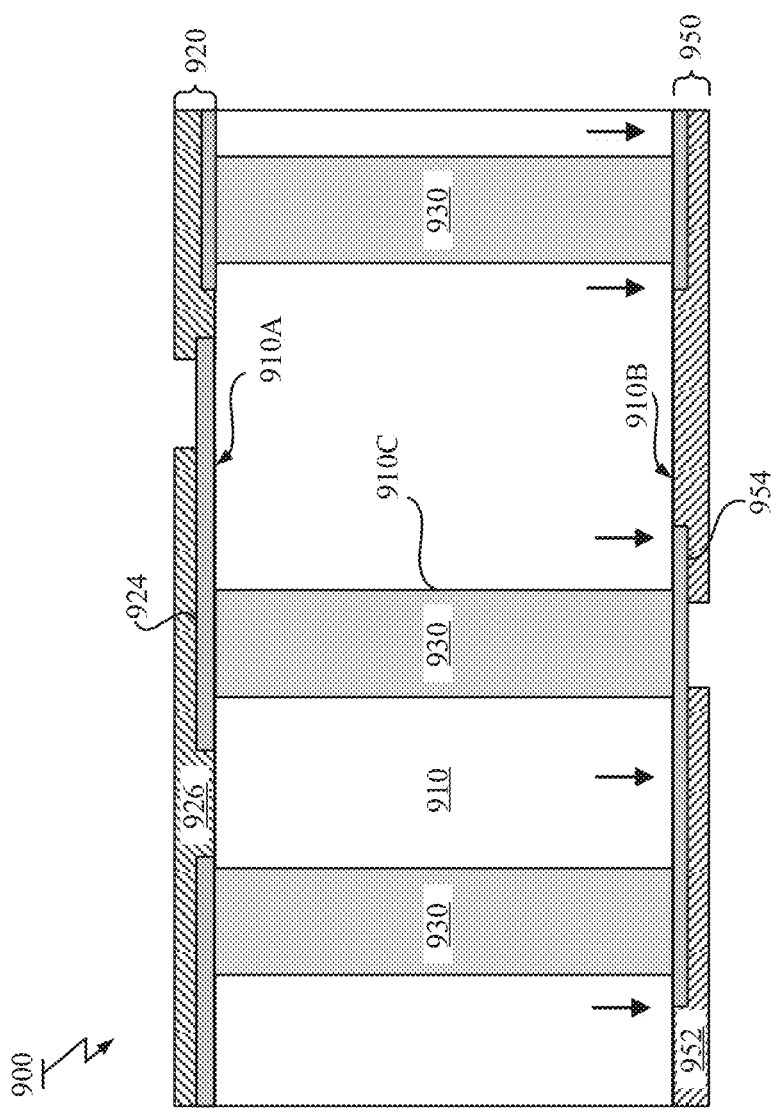
FIG. 1 illustrates a cross-sectional view of conventional solder TGV (Through Glass Via) structure.

Hereinafter, referring to FIG. 1, a schematic of a conventional solder TGV (Through Glass Via) structure, which can be used as an interposer for electronic packaging, will be described. FIG. 1 illustrates a cross-sectional view of the conventional solder TGV structure 900.

As shown in FIG. 1, the conventional solder TGV structure 900 includes a glass substrate 910 that has top and bottom surfaces 910A and 910B; a through via 930 formed within the glass substrate 910; a redistribution layer 920 formed on the top surface 910A; and a back side redistribution layer 950 formed on the bottom surface 910B of the glass substrate 910.

The glass substrate 910 has a via hole 910C that penetrates through the glass substrate 910 from the top surface 910A to the bottom surface 910B. The via hole 910C is made conductive by filling the via hole 910C with solder to give the through via 930. The redistribution layer 920 includes a metal wiring layer 924 on the glass substrate 910 and a polymer dielectric layer 926 over the metal wiring layer 924. Also the backside redistribution layer 950 includes a metal wiring layer 954 on the glass substrate 910 and a polymer dielectric layer 952 over the metal wiring layer 954.

At both ends of the through via 930, the metal wiring layers (924, 954), both of which are disposed directly on the surface (910A or 910B) of the glass substrate 910, cover the conductive material that is filled in the via hole 910C.

In the conventional solder TGV structure 900, the solder through via would pump up the rigid metal wiring layer that covered on the through via after fabrication process, which then would result in cracks in the brittle glass substrate due to stress generated around the end of the solder through via, as indicated by arrows in FIG. 1.

In light of aforementioned phenomena observed in the conventional solder TGV structure, one or more embodiments according to the present invention are directed to novel via structures, methods for fabricating the via structures and electronic apparatus including the via structure, in which a stress buffer layer is disposed on a substrate for reducing stress generated around via structure.

Hereinafter, referring to FIG. 2 and FIG. 3, representative via structures according to one or more exemplary embodiments of the present invention will be described.

Figure 2A:
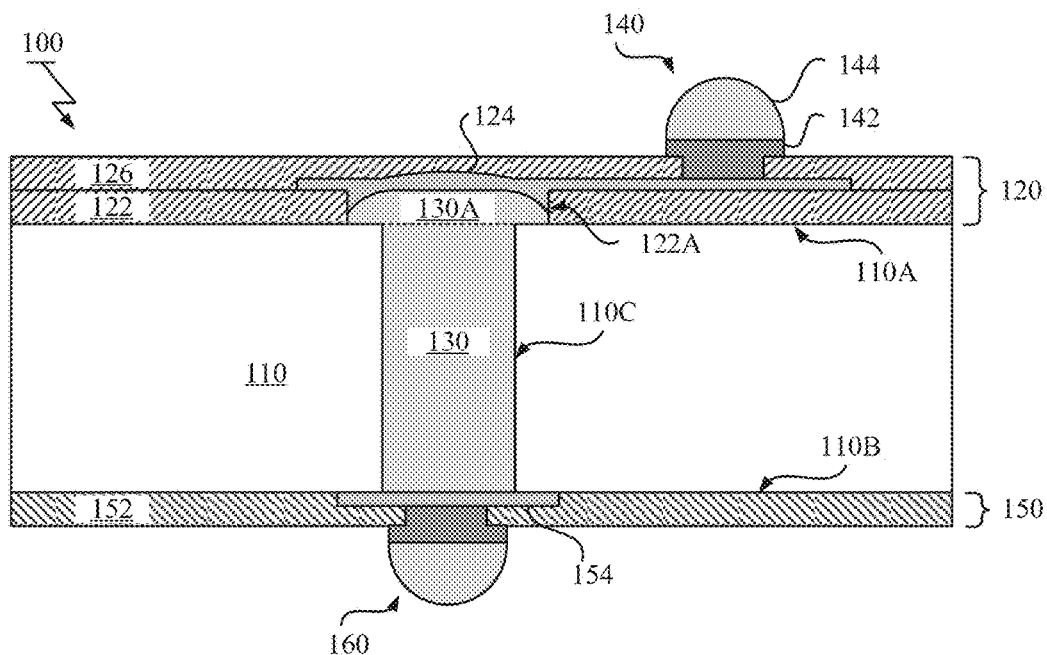
FIG. 2A illustrates a cross-sectional view of a through via structure with one side stress buffer layer according to one exemplary embodiment of the present invention.

FIG. 2A illustrates a cross-sectional view of a novel through via structure with one side stress buffer layer according to one exemplary embodiment. As shown in FIG. 2A, the through via structure 100 may include a substrate 110; a redistribution layer 120 including a stress buffer layer 122; a through via 130; and a back side redistribution layer 150. The through via structure 100 shown in FIG. 2A can be used as an interposer for electronic packaging.

The substrate 110 has a top surface 110A, a bottom surface 110B and a via hole 110C. The via hole is a through hole that penetrates through the substrate 110 from the top surface 110A to the bottom surface 110B. The substrate 110 may be made of any one of non-conductive substrate materials, however, the present technique preferably can be applicable to substrate materials having some degree of brittleness such as glass, silicon, etc. to name but a few. In a particular embodiment, the thickness of the substrate 110 may be in the range of approximately 50 to 1000 micrometers (50~1000 um).

The via hole 110C may be made conductive by filling the via hole 110C with conductive material to give the through via 130. The diameter of the via hole 110C may be in the range of approximately 20 to 100 micrometers. The through via 130 may be made of any one of conductive materials, however, the present technique preferably can be applicable to a solder such as SAC (SnAgCu), tin alloys or other lead-free alloys, which can be used in IMS (Injection Molded Solder) technology. The through via 130 may provide a conductive path between external devices disposed on the top and bottom sides of the through via structure 100.

The redistribution layer 120 may include the stress buffer layer 122, a metal wiring layer 124 and a polymer dielectric layer 126. The stress buffer layer 122 may be made of any one of polymer dielectrics with low young's modulus, which may include polyimide (~5 GPa), BCB (benzocyclobutene) resin(~5 GPa), PTFE (polytetrafluoroethylene) resin (0.5 GPa), to name but a few. In a particular embodiment, the thickness of the stress buffer layer 122 may be in the range of approximately 1 to 5 micrometers (1~5 um).

The metal wiring layer 124 can be made of copper and nickel, but may be made of any one of metals (e.g., Cu, Ni, Pt, Al, Au, etc.) as long as it is adequate for respective material of the wiring layer. The metal wiring layer 124 may have a conductive element or wiring pattern connecting the through via 130 with external terminals that may be connected to the external device. The thickness of the metal wiring layer 124 may be in the range of approximately 5 to 15 micrometers (5~15 um).

The polymer dielectric layer 126 may be made of any one of polymer dielectrics with low young's modulus, which may include polyimide, BCB resin, PTFE resin to name but a few. The polymer dielectric layer 126 may be disposed over the metal wiring layer 124.

In the embodiment shown in FIG. 2A, the stress buffer layer 122 may be disposed on the top surface 110A of the substrate 110 and may have an opening 122A aligned to the via hole 110C of the substrate 110. The through via 130 may be formed at least up to the level of the top surface 110A. In the embodiment shown in FIG. 2A, the conductive material may be filled into further the opening 122A of the stress buffer layer 122 at least in part. Thus, the through via 130 may have a protrusion part 130A that extends into the opening 122A over the level of the top surface 110A while the stress buffer layer 122 receives the protrusion part 130A. The metal wiring layer 124 may be disposed on the stress buffer layer 122 and on top of the protrusion part 130A in a manner such that the metal wiring layer 124 is excluded from vicinity of the top surface 110A of the substrate 110 around the via hole 110C by the protrusion part 130A of the through via 130.

The backside redistribution layer 150 may include a polymer dielectric layer 152 and a metal wiring layer 154. The materials of the polymer dielectric layer 152 and the metal wiring layer 154 may be same as the polymer dielectric layer 126 and the metal wiring layer 124, respectively.

As shown in FIG. 2A, the through via structure 100 may further include bumps 140 160. The bump 140 may be formed on a pad of the metal wiring layer 124, which may be exposed through an opening of the polymer dielectric layer 126. The bumps 140 may include copper post 142 and a solder 144. The bump 140 may be electrically connected with the through via 130 formed in the via hole 110C through the metal wiring layer 124. The bump 160 may also be formed on a pad of the metal wiring layer 154. The bumps 140, 160 may work as external terminals that are configured to be connected to respective external devices.

According to the embodiment shown in FIG. 2A, since the metal wiring layer 124 having rigid material is separated from the top surface 110A of the substrate 110 by the protrusion part 130A of the through via 130, stress that may affect the substrate 110 can be reduced, in comparison with conventional structure 900 that has the metal wiring layer 924 directly on the surface 910A of the substrate 910 as shown in FIG. 1A.

Figure 2B:
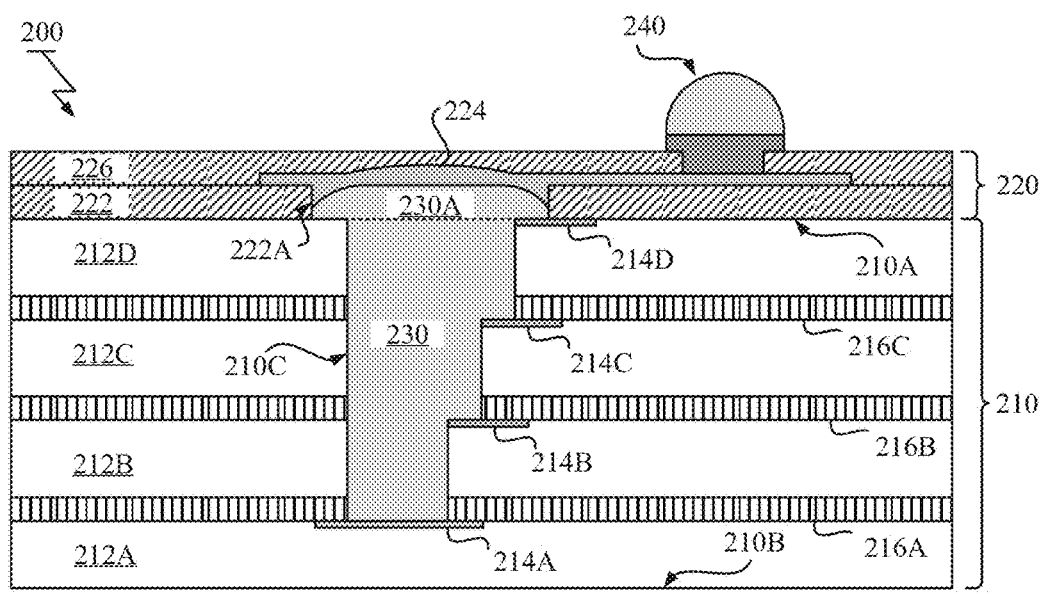
FIG. 2B illustrates a cross-sectional view of a Vias (Vertical integration after stacking) structure with one side stress buffer layer according to one exemplary embodiment of the present invention.

FIG. 2B illustrates a cross-sectional view of a novel Vias (Vertical integration after stacking) structure with one side stress buffer layer according to one exemplary embodiment. As shown in FIG. 2B, the Vias structure 200 may include a stacked substrate 210; a redistribution layer 220 including a stress buffer layer 222; a through via 230: and a bump 240. The Vias structure 200 can also be used as an interposer for electronic packaging.

As shown in FIG. 2B, the stacked substrate 210 may include a plurality of substrate layers 212. The stacked substrate 210 may have a via hole 210C, which penetrates through at least one of the substrate layers 212 from the top surface 210A of the stacked substrate 210.

As shown in FIG. 2B, there are four substrate layers 212A-212D in the stacked substrate 210 for a purpose of illustration. However, the number of the substrate layers 212 may not be limited to the specific embodiment shown in FIG. 2B. In one or more other embodiments, two, three or more than four substrate layers may be stacked to form the stacked substrate 210.

As shown in FIG. 2B, each substrate layer 212 may include an electrode 214 and an insulator 216 formed on the substrate layer 212. Each substrate layer 212 may be made of any one of non-conductive substrate materials. However, the present technique preferably can be applicable to substrate materials that have some degree of brittleness such as silicon, glass, etc. to name but a few. The insulator 216 may be made from a resin such as BCB (benzocyclobutene) resin, etc. In a particular embodiment, the total thickness of the stacked substrate 210 may be in the range of approximately 50 to 1000 micrometers (50~1000 um).

The via hole 210C may be made conductive by filling the via hole 210C with conductive material to give the through via 230. The conductive material for the through via 230 may be a solder. The through via 230 may be formed within the stacked substrate 210 to provide a conductive path between external devices disposed on the Vias structure 200. Note that the through via 230 may be or may not be formed completely through the stacked substrate 210 from the top surface 210A to the bottom surface 210B. In the embodiment shown in FIG. 2B, the through via 230 is formed through the substrate layers 212B~212D other than the bottom substrate layer 212A.

The redistribution layer 220 may include, as similar to the through via structure 100, the stress buffer layer 222, a metal wiring layer 224 and a polymer dielectric layer 226. The stress buffer layer 222 may be disposed on the top surface 210A of the stacked substrate 210 and may have an opening 222A aligned to the via hole 210C of the stacked substrate 210. The through via 230 may have a protrusion part 230A that extends into the opening 222A over the level of the top surface 210A while the stress buffer layer 222 receives the protrusion part 230A. The metal wiring layer 224 may be disposed on the stress buffer layer 222 and on top of the protrusion part 230A in a manner such that the metal wiring layer 224 is excluded from the vicinity of the top surface 210A of the stacked substrate 210 around the via hole 210C by the protrusion part 230A. The metal wiring layer 224 may also include a pad on which the bump 240 may be formed.

According to the embodiment shown in FIG. 2B, since the metal wiring layer 224 having rigid material is separated from the top surface 210A of the stacked substrate 210 by the protrusion part 230A, stress that may affect the stacked substrate 210 would be reduced.

Figure 3A:
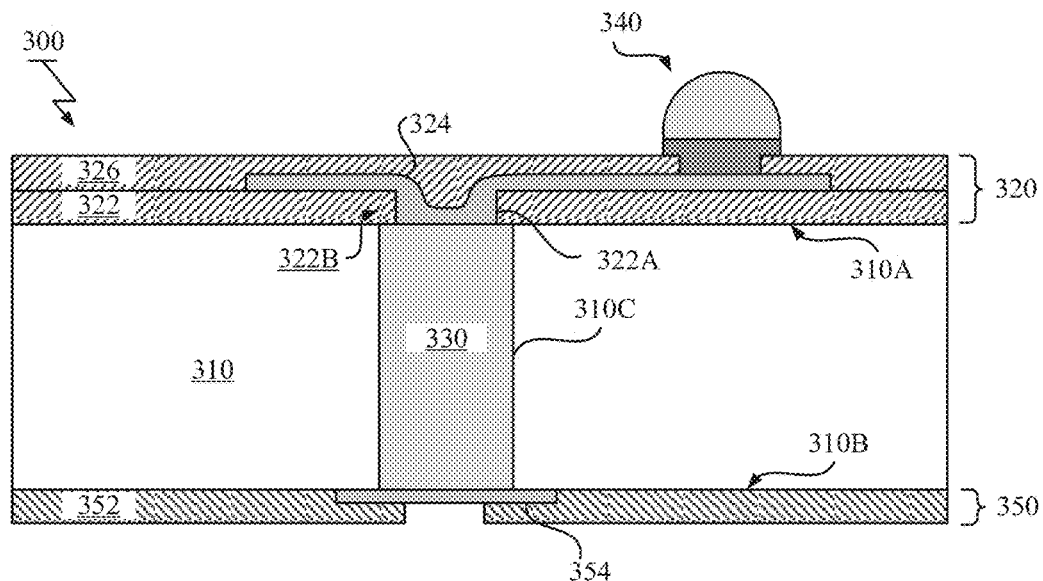
FIG. 3A illustrates a cross-sectional view of alternative through via structure with one side stress buffer layer according to one exemplary embodiment of the present invention.

FIG. 3A illustrates a cross-sectional view of an alternative through via structure with one side stress buffer layer according to one exemplary embodiment. As shown in FIG. 3A, the through via structure 300 may include a substrate 310; a redistribution layer 320; a through via 330; and a back side redistribution layer 350, similar to the embodiment shown in FIG. 2A.

In the embodiment shown in FIG. 3A, the through via 330 may be filled just up to the level of the top surface 310A of the substrate 310. The redistribution layer 320 may include a stress buffer layer 322, a metal wiring layer 324 and a polymer dielectric layer 326. The stress buffer layer 322 may be disposed on the top surface 310A of the substrate 310 and may have an opening 322A aligned to the via hole 310C of the substrate 310. The metal wiring layer 324 may be disposed on the stress buffer layer 322 and the through via 330, and may include a pad on which the bump 340 may be formed.

In the embodiment shown in FIG. 3A, the opening 322A of the stress buffer layer 322 may have a scale smaller than the scale of the via hole 310C, thus the stress buffer layer 322 have an extended part 322B that covers, at least in part, the edge of the top surface 310A of the substrate 310 around the via hole 310C in a manner such that the metal wiring layer 324 is excluded from the vicinity of the top surface 310A of the substrate 310 around the via hole 310C by the extended part 322B of the stress buffer layer 322.

According to the embodiment shown in FIG. 3A, since the metal wiring layer 324 with rigid material is separated from the top surface 310A of the substrate 310 by the extended part 322B of the stress buffer layer 322, stress that may affect the substrate 310 would be reduced.

Figure 3B:
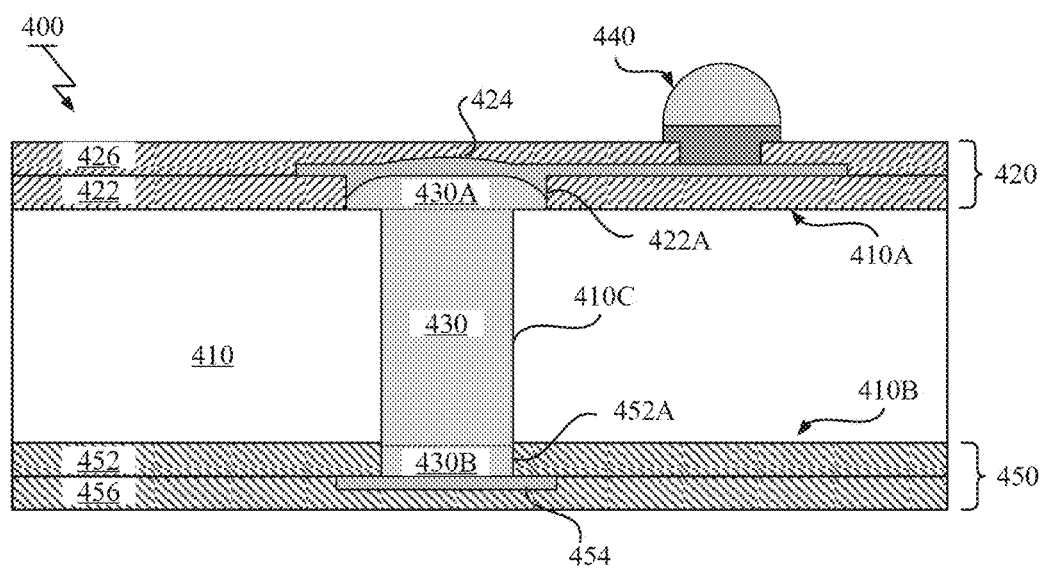
FIG. 3B shows a cross-sectional view of through via structure with both side stress buffer layers according to one exemplary embodiment of the present invention.

FIG. 3B illustrates a cross-sectional view of a novel through via structure with both side stress buffer layers according to one exemplary embodiment. As shown in FIG. 3B, the through via structure 400 may include a substrate 410; a redistribution layer 420 including a top stress buffer layer 422; a through via 430; and a back side redistribution layer 450 including a bottom stress buffer layer 452.

In comparison with the through via structure 100 shown in FIG. 2A, there is the bottom stress buffer layer 452 on the back side of the through via structure 400. The stress buffer layers 422, 452 may be made of any one of polymer dielectrics with low young's modulus and has adequate thickness similar to the stress buffer layer (122, 222, 322) according to the aforementioned embodiments. The remaining part other than the back side redistribution layer 450 is almost same as the embodiment shown in FIG. 2A unless otherwise noted.

In the embodiment shown in FIG. 3B, the stress buffer layer 452 may be disposed on the bottom surface 410B of the substrate 410 and may have an opening 452A aligned to the via hole 410C of the substrate 410. The conductive material may also be filled into further the opening 452A of the stress buffer layer 452 at least in part, in addition to the opening 422A of the stress buffer layer 422. Thus, in addition to the protrusion part 430A, the through via 430 may have a protrusion part 430B that extends into the opening 452A over the level of the bottom surface 410B while the stress buffer layer 452 receives the protrusion part 430B.

The metal wiring layer 454 for the back side redistribution layer 450 may be disposed on the stress buffer layer 452 and on top of the protrusion part 430B in a manner such that the metal wiring layer 454 is excluded from vicinity of the bottom surface 410B around the via hole 410C by the protrusion part 430B.

According to the embodiment shown in FIG. 3B, since the metal wiring layers 424 454 with rigid materials are separated from vicinity of the surfaces 410A, 410B of the substrate 410 by the protrusion parts 430A, 430B of the stress buffer layers 422,452, stress that may affect the substrate 410 at both ends of the through via 430 would be reduced, even if an aspect ratio of the through via 430 is relatively high.

The structure with both side stress buffer layers may not be limited to the specific embodiment shown in FIG. 3B. Similar to the embodiment shown in FIG. 3B, the through via structure 300 shown in FIG. 3A can have further a bottom stress buffer layer in the back side redistribution layer 350. Furthermore, similar to the embodiment shown in FIG. 2B, the Vias structure 200 shown in FIG. 2B can have further a bottom stress buffer layer in a back side redistribution layer when the through via 230 is formed completely through the stacked substrate 210.

Hereinafter, referring to series of FIGS. 4A-4G, a fabrication process for fabricating the novel via structure 100 shown in FIG. 2A will be described.

Figure 4A:
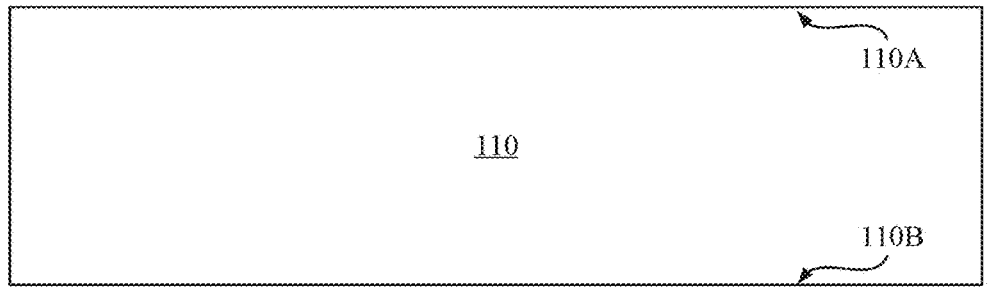
FIGS. 4A, 4B, 4C, 4D, 4E, 4F and 4G illustrate a process for fabricating the through via structure shown in FIG. 2A according to one exemplary embodiment of the present invention.

As shown in FIG. 4A, the fabrication process may include a step of preparing a substrate 110 that has top and bottom surfaces 110A, 110B.

Figure 4B:
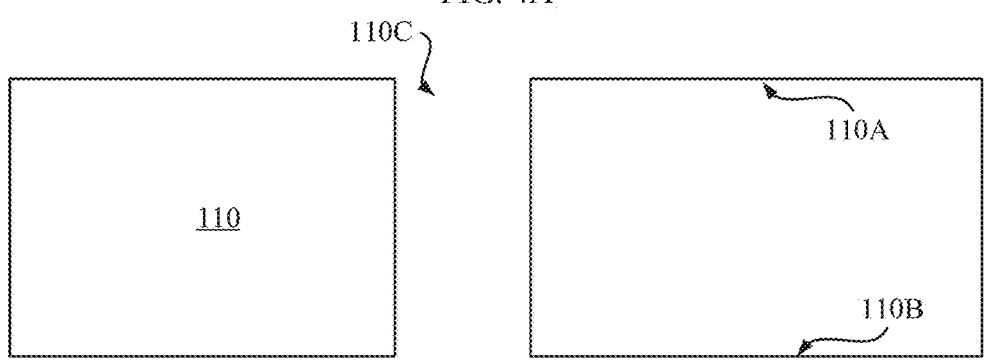

As shown in FIG. 4B, the fabrication process may also include a step of fabricating a via hole 110C through the substrate 110 from the top surface 110A. In the described embodiment, the via hole 110C penetrates through the substrate 110 from the top surface 110A to bottom surface 110B. The step of fabricating of the via hole 110C may be done by using any conventional process, which may include ultrasonic drilling, sand blasting, wet or dry etching, laser drilling, to name but a few.

Figure 4C:
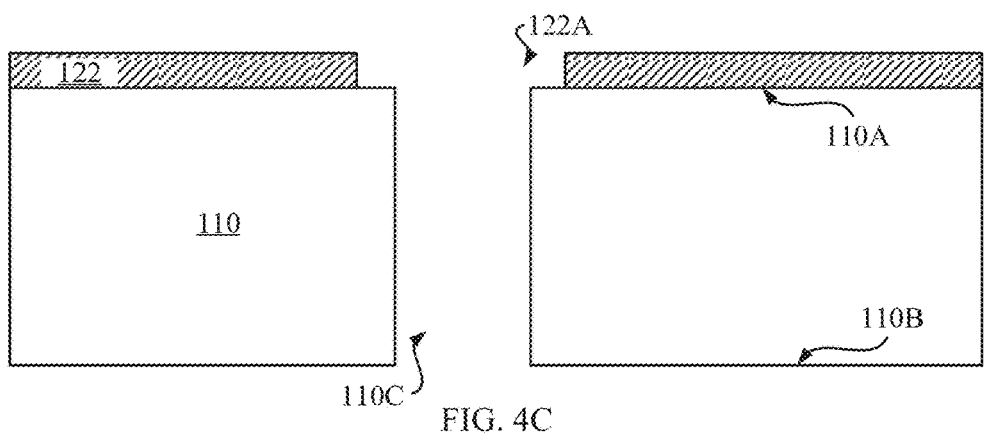

As shown in FIG. 4C, the fabrication process may further include a step of disposing a stress buffer layer 122 on the top surface 110A of the substrate 110, in which the stress buffer layer 122 has an opening 122A aligned to the via hole 110C. The stress buffer layer 122 can be formed by any known patterning technology, which may include laser processing, photo-lithography, etc. to name but a few.

Figure 4D:
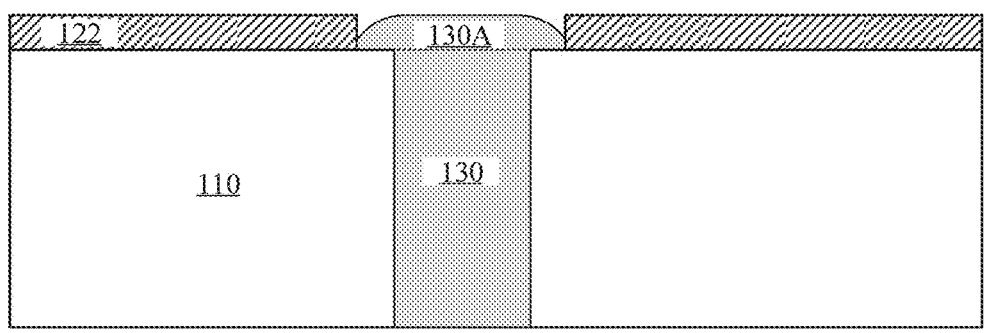

As shown in FIG. 4D, the fabrication process may further include a step of filling the via hole 110C and the opening 122A with a conductive material to form the through via 130. In this step, a protrusion part 130A that extends into the opening 122A of the stress buffer layer 122 is formed over the level of the top surface 110A.

The through via 130 can be formed preferably by IMS (Injection Molded Solder) technology, in which molten solder are injected into the via hole 110C and cooled to be solidified. During the process of the IMS, the backside opening of the via hole 110C may be covered by a stage, which may include a porous aluminum nitride (AlN) base and a porous PTFE (polytetrafluoroethylene) layer on the porous AlN base.

Figure 4E:
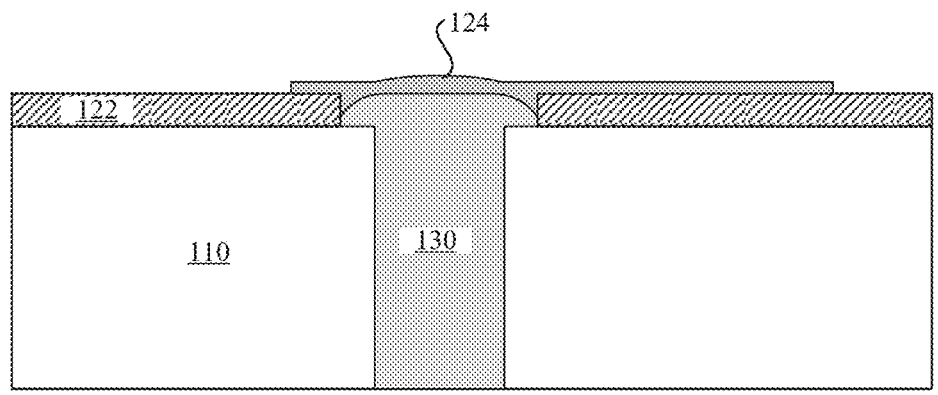

As shown in FIG. 4E, the fabrication process may further include a step of disposing a metal material on the stress buffer layer 122 and the through via 130 to form the metal wiring layer 124. The conductive element or the wiring pattern can be formed by any known metallization process.

Figure 4F:
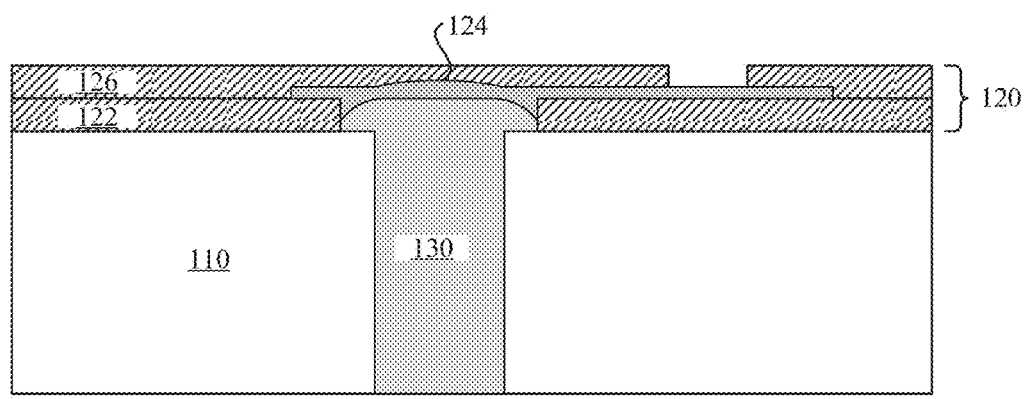
Figure 4G:
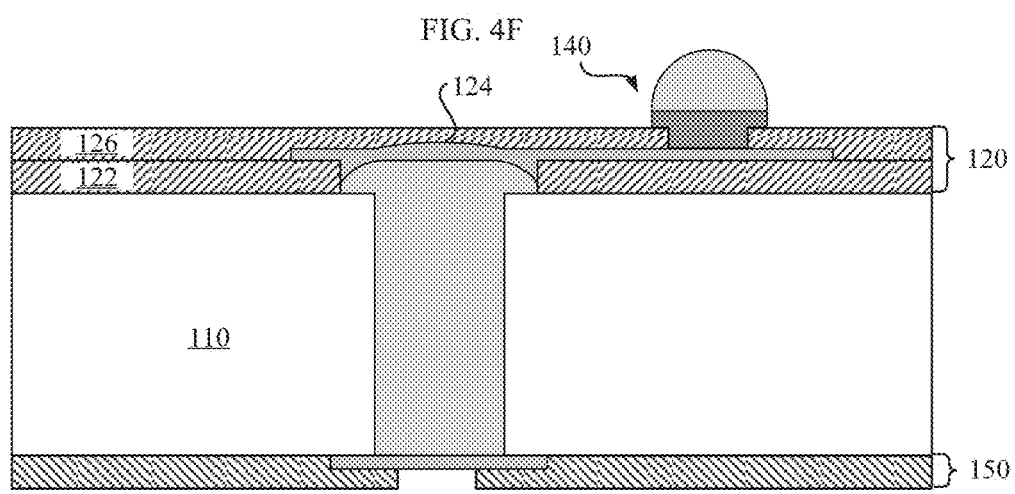

As shown in FIG. 4F, the fabrication process may further include a step of disposing a polymer dielectric layer 126 over the metal wiring layer 124 and the stress buffer layer 122 to form the redistribution layer 150 on the substrate 110. The polymer dielectric layer 126 may have an opening at a bond pad location. The polymer dielectric layer 126 can be formed by any known patterning technology.

As shown in FIG. 4F, the fabrication process may further include a step of forming remaining structure that includes a bump 140 and a back side redistribution layer 150 by using any known techniques. The bump 140 can be formed on a pad of the metal wiring layer 124 via the opening of the polymer dielectric layer 126.

Note that the steps shown in FIG. 4 (FIGS. 4A-4G) may not be required to be performed in the sequence as described above. For example, the sequence of the step of fabricating the via hole 110C and the step of disposing the stress buffer layer 122 may not be limited to the aforementioned example. In one or more embodiments, the step of disposing the stress buffer layer 122 can be performed prior to or posterior to the step of fabricating the via hole 110C. Also, fabrication of the via hole 110C in the substrate 110 and the opening 122A in the stress buffer layer 122 can be done concurrently.

Also, note that the step of filling of the via hole 110C can be divided into a plurality of sub steps, which may include filling of the via hole 110C with the conductive material up to the level of the top surface 110C and forming the protrusion part 130A over the level of the top surface 110A. The first sub step can be done prior to or posterior to the step of disposing of the stress buffer layer 122. The second sub step can be done posterior to the disposing of the stress buffer layer 122.

Hereinafter, referring to series of FIGS. 5A-5F, a fabrication process for fabricating the novel Vias structure 200 shown in FIG. 2B will be described.

Figure 5A:
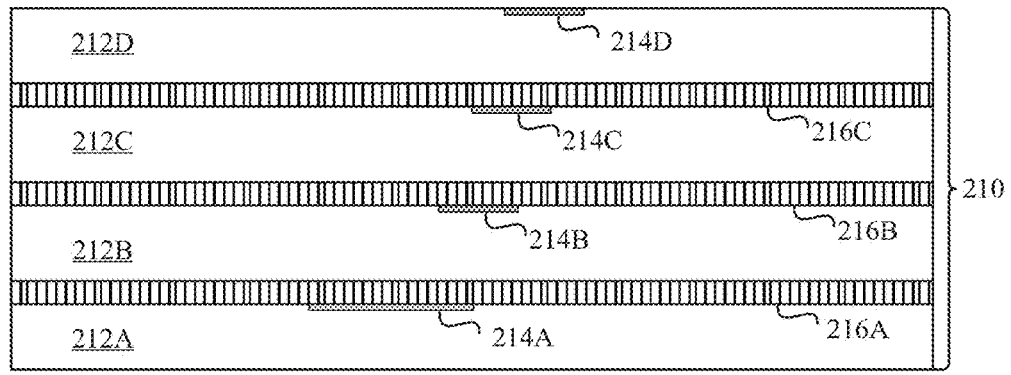
FIGS. 5A, 5B, 5C, 5D, 5E and 5F illustrate a process for fabricating the Vias structure shown in FIG. 2B according to one exemplary embodiment of the present invention.

As shown in FIG. 5A, the fabrication process may include a step of preparing a stacked substrate 210 that includes a plurality of substrate layers 212. Each substrate layer includes an electrode 214 and an insulator 216 formed on each substrate layer 212. The step of preparing may include a sub step of stacking a plurality of the substrate layers 212 as the substrate 210.

Figure 5B:
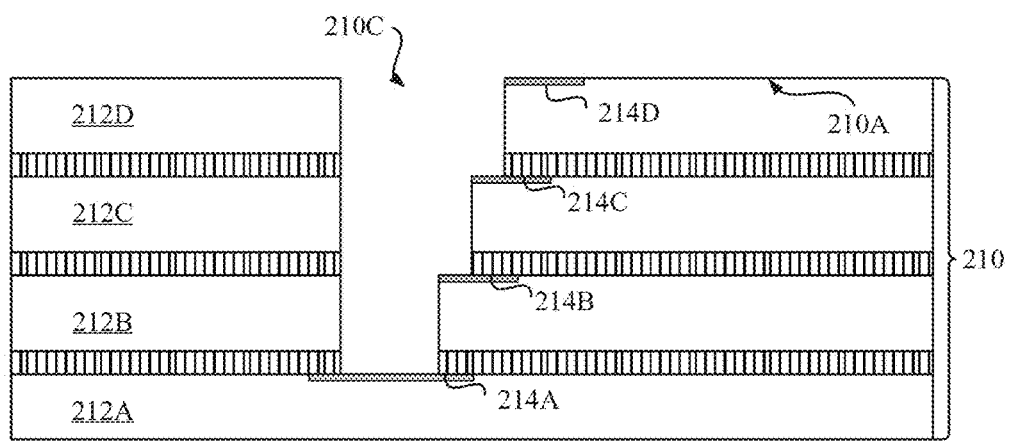

As shown in FIG. 5B, the fabrication process may also include a step of fabricating a via hole 210C through the stacked substrate 210 from the top surface 210A. In the described embodiment, the via hole 210C is penetrated through three substrate layers 212B~212D from the top surface 210A to the bottom layer electrode 214. The step of fabricating of the via hole 210C may be done at once by using any conventional process such as etching.

Figure 5C:
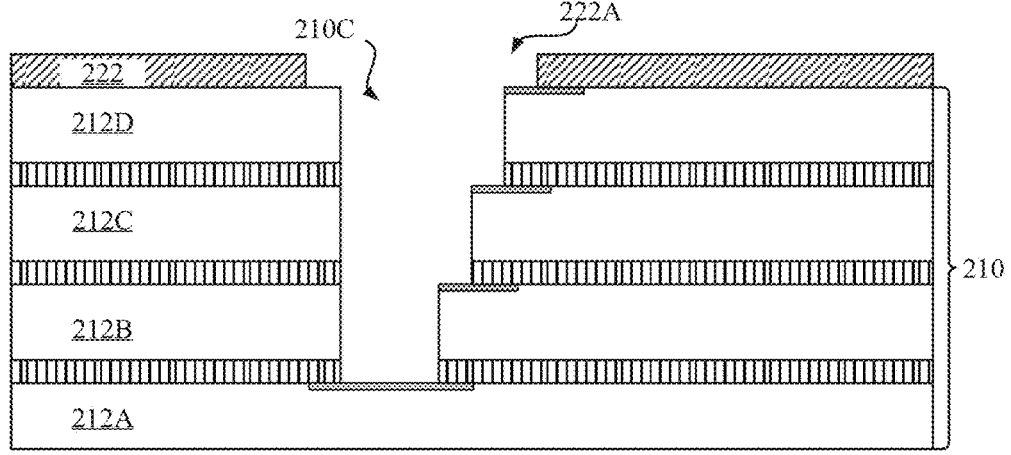

As shown in FIG. 5C, the fabrication process may further include a step of disposing a stress buffer layer 222 that has an opening 222A aligned to the via hole 210C on the top surface 210A.

Figure 5D:
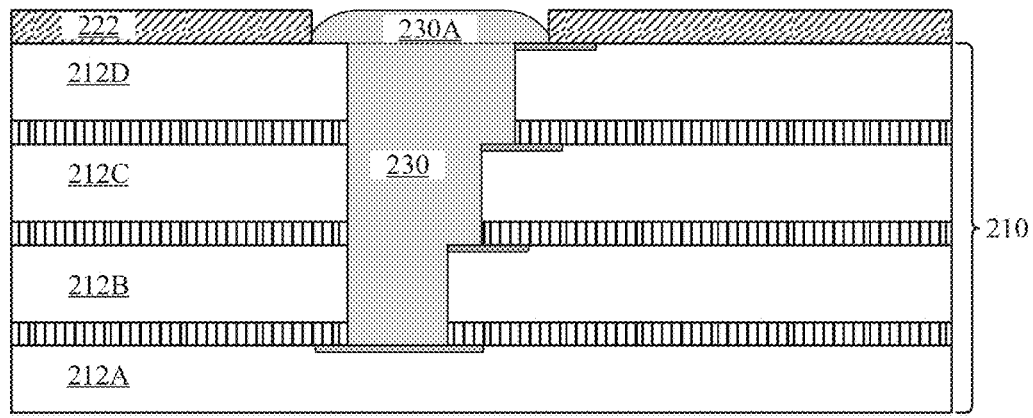

As shown in FIG. 5D, the fabrication process may further include a step of filling of the via hole 210C and the opening 222A with a conductive material to form the through via 230. The through via 110 can be formed preferably by IMS (Injection Molded Solder) technology. In a particular embodiment, the via hole 210C can be insulated by polymer coating with a low-Young's modulus and filled with solder so that a formation of interlayer connections of arbitrary choice is possible. The through via 230 may be continuous from the bottom to the top through the stacked substrate 210 and the conductive body may be surrounded with polymer insulators. In this step, a protrusion part 230A that extends into the opening 222A of the stress buffer layer 122 may be formed over the level of the top surface 210A.

Figure 5E:
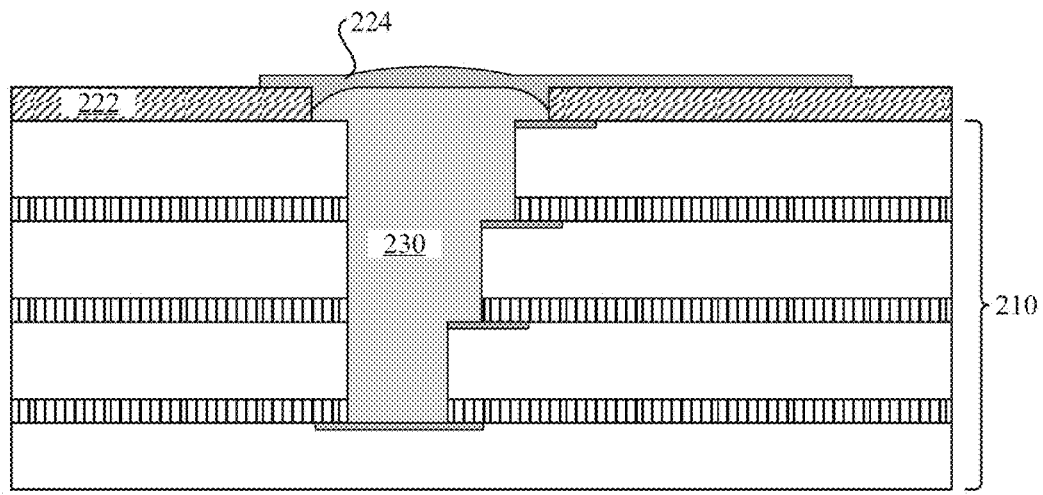
Figure 5F:
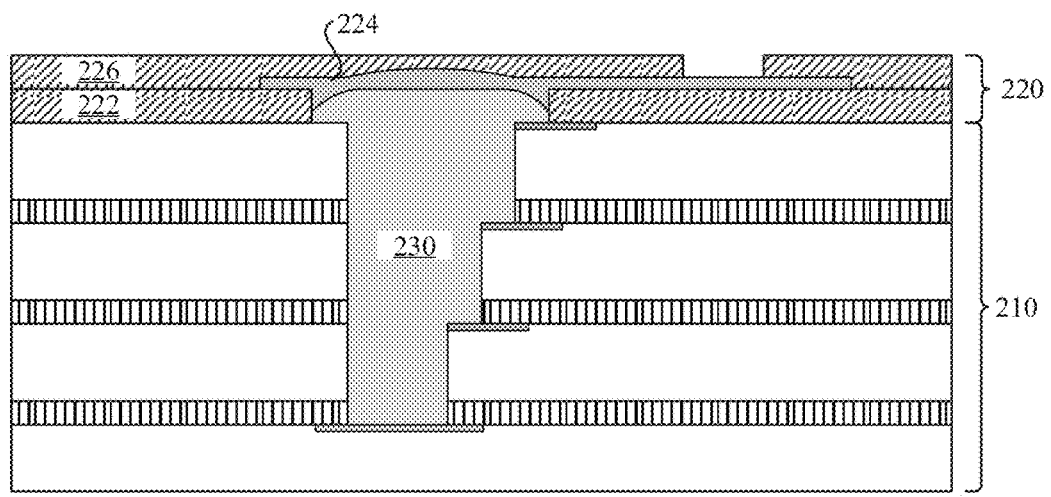

As shown in FIG. 5E, the fabrication process may further include a step of disposing a metal material on the stress buffer layer 222 and on top of the through via 130 to form the metal wiring layer 224. As shown in FIG. 5F, the fabrication process may further include a step of disposing a polymer dielectric layer 226 over the metal wiring layer 224 and the stress buffer layer 222 to form the redistribution layer 250 on the stacked substrate 210.

After steps shown in FIG. 5F, remaining structures which may include a bump 240 may be processed by using any known techniques.

Figure 6A:
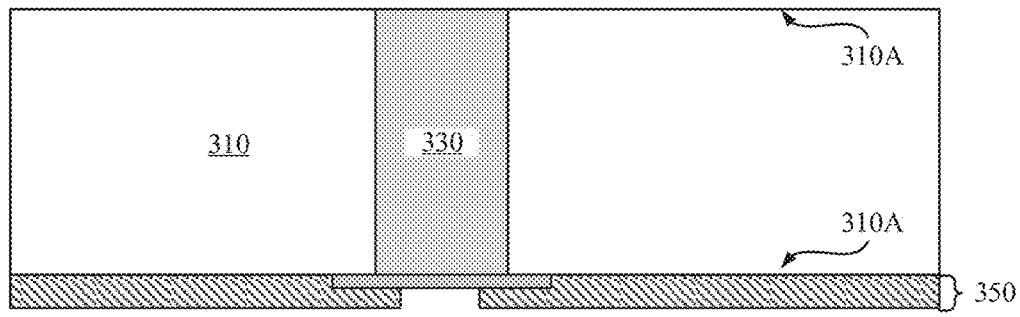
FIGS. 6A, 6B, 6C and 6D illustrate a process for fabricating the alternative through via structure shown in FIG. 3A according to one exemplary embodiment of the present invention.

Hereinafter, referring to series of FIGS. 6A-6D, a fabrication process for fabricating the novel via structure 300 shown in FIG. 3A will be described. As shown in FIG. 6A, the fabrication process may include a step of preparing the substrate 310 that has top and bottom surfaces 310A, 310B, a through via 330 and the back side redistribution layer 350. In the described embodiment, the through via 330 may be fabricated through the substrate 310 from the top surface 310A to bottom surface 310B.

Figure 6B:
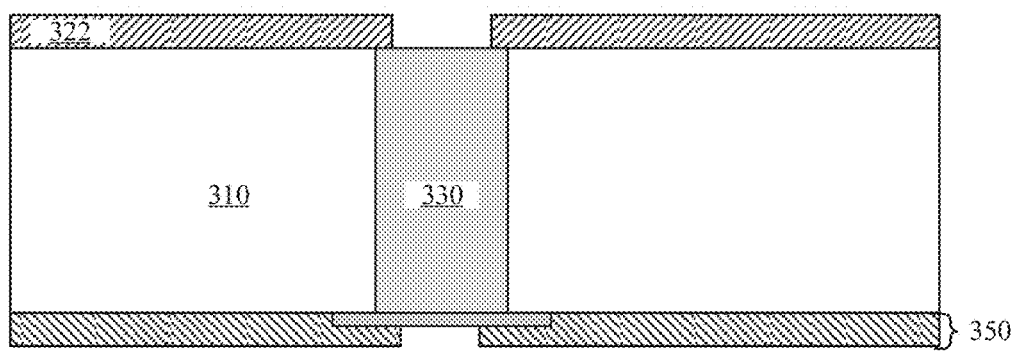
Figure 6C:
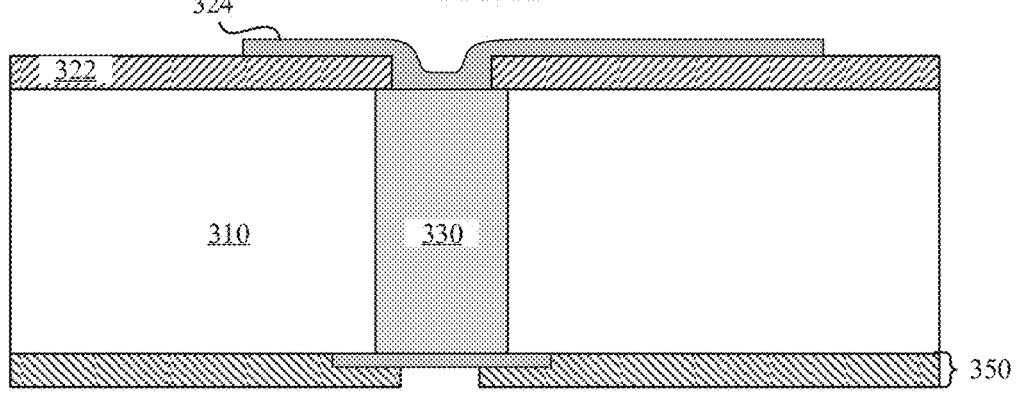
Figure 6D:
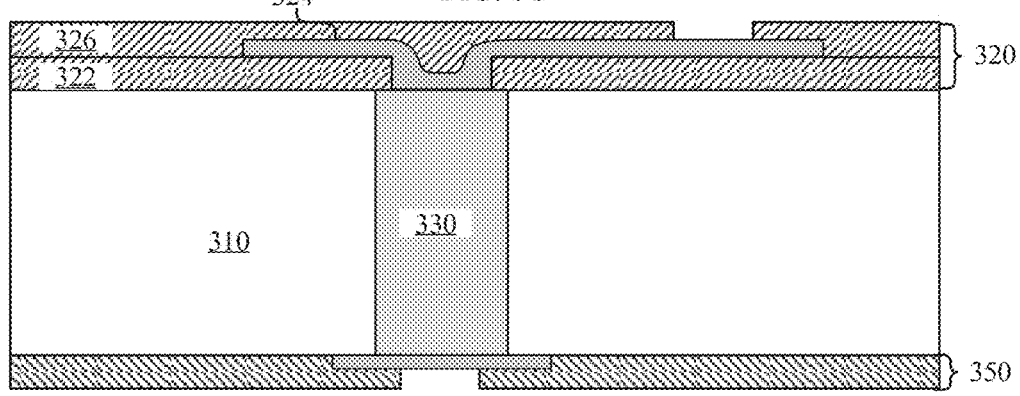

As shown in FIG. 6B, the fabrication process may further include a step of disposing a stress buffer layer 322 having an opening 322A on the top surface 310A and the through via 330. As shown in FIG. 6D, the fabrication process may further include a step of disposing a metal material on the stress buffer layer 322 and on top of the through via 330 to form the metal wiring layer 324. As shown in FIG. 6D, the fabrication process may further include a step of disposing a polymer dielectric layer 326 over the metal wiring layer 324 and the stress buffer layer 322 to form the redistribution layer 350. After step shown in FIG. 6D, remaining structures including a bump 340 may be processed by using any known techniques.

Figure 7A:
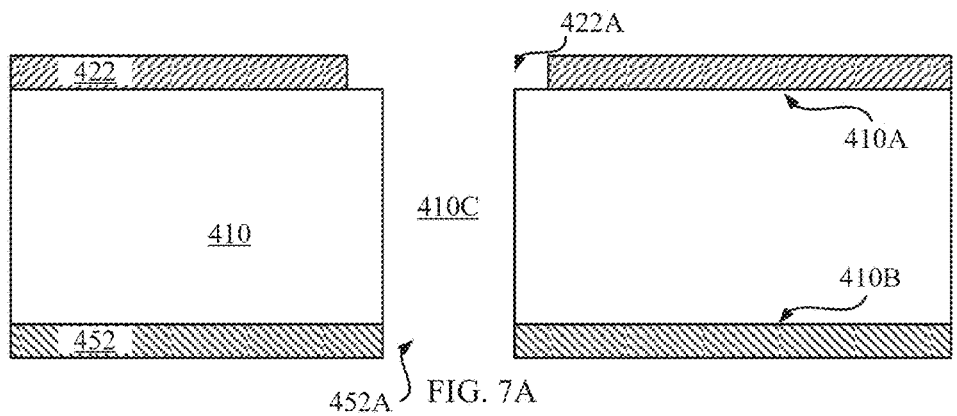
FIGS. 7A, 7B, 7C and 7D illustrate a process for fabricating the through via structure with both side stress buffer layers shown in FIG. 3B according to one exemplary embodiment of the present invention.

Referring to series of FIGS. 7A-7D, a fabrication process for fabricating the novel via structure 400 shown in FIG. 3B is illustrated. As shown in FIG. 7A, the fabrication process may include a step of preparing the substrate 410 that has top and bottom surfaces 410A, 410B, a via hole 410C, a top stress buffer layer 422 on the top surface 410A and a bottom stress buffer layer 452 on the bottom surface 410B. In the embodiment, the top stress buffer layer 422 has an opening 422A aligned to the via hole 410C. The bottom stress buffer layer 452 also has an opening 452A aligned to the via hole 410C.

Figure 7B:
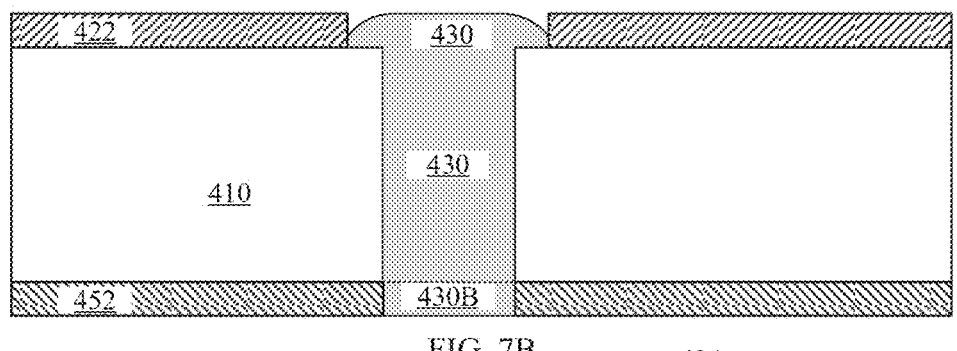

As shown in FIG. 7B, the fabrication process may further include a step of filling the via hole 410C, the opening 422A and the opening 452A with a conductive material to form the through via 430. In this step, a protrusion part 430A that extends into the opening 422A of the top stress buffer layer 422 may be formed over the level of the top surface 410A. The stress buffer layer 422 may receive the protrusion part 430A. Furthermore, a protrusion part 430B that extends into the opening 452A of the bottom stress buffer layer 452 may be formed over the level of the bottom surface 410B. The stress buffer layer 452 may receive the protrusion part 430B.

Figure 7C:
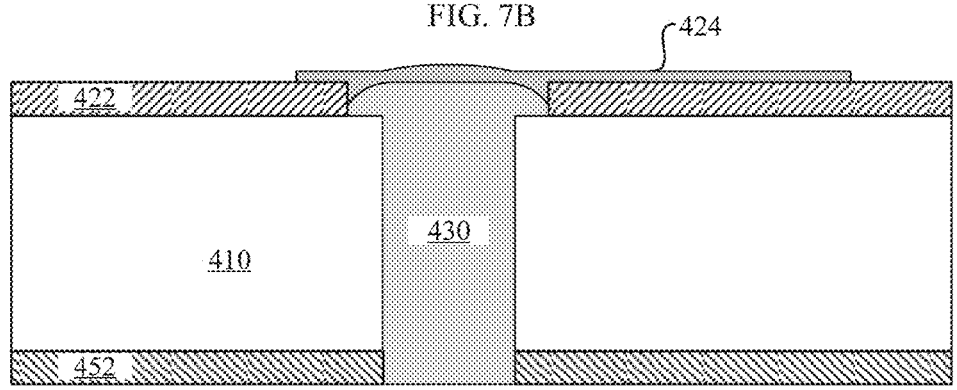
Figure 7D:
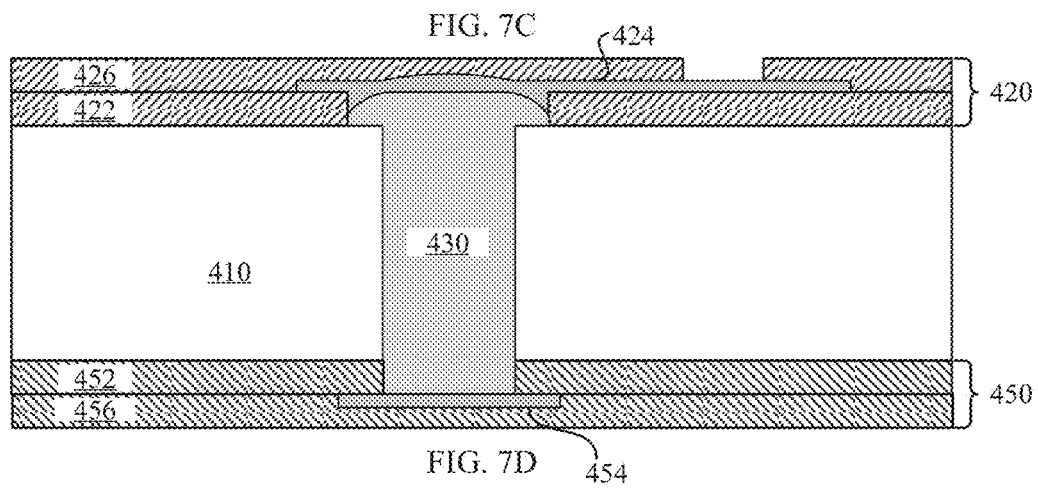

As shown in FIG. 7C, the fabrication process may further include a step of disposing a metal material on the stress buffer layer 422 and on top of the through via 430 to form the metal wiring layer 424. As shown in FIG. 7D, the fabrication process may further include a step of forming redistribution layers 420, 450 on the substrate 410. The redistribution layer 420 may be composed of the top stress buffer layer 422, the metal wiring layer 424 and the polymer dielectric layer 426. The redistribution layer 450 may be composed of the bottom stress buffer layer 452, a metal wiring layer 454 formed over the through via 430 and a polymer dielectric layer 456 formed over metal wiring layer 454. After step shown in FIG. 7D, remaining structures including a bump 440 may be processed by using any known techniques.

Figure 8A:
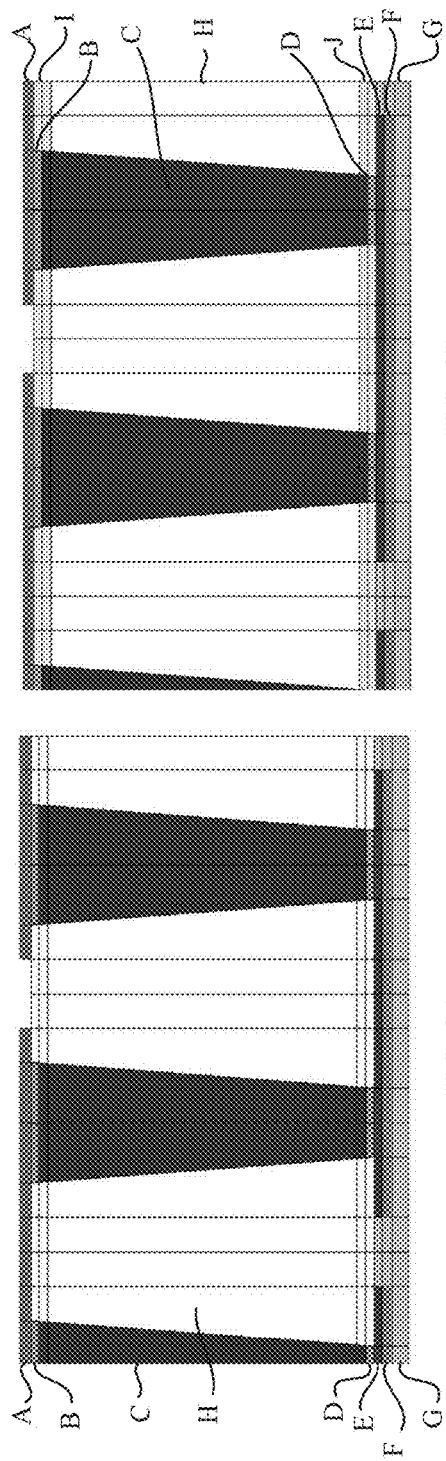
FIGS. 8A, 8B, 8C and 8D show results of stress modeling of TGV structures with and without stress buffer layers.
Figure 8B:
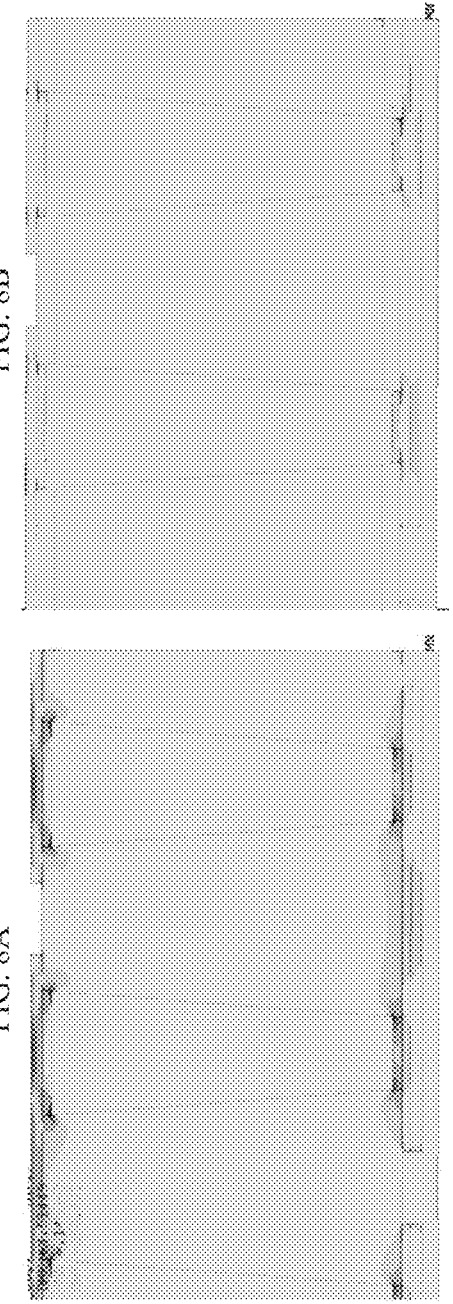
Figure 8C:
Figure 8D:
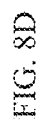

Hereinafter, referring to FIG. 8, results of structural analysis will be described. FIG. 8 shows results of stress modeling of TGV structures with and without stress buffer layers. FIG. 8A shows model of TGV structure without any stress buffer layer, whereas FIG. 8B shows model of TGV structure with top and bottom stress buffer layers. FIG. 8C shows a distribution of principal stress (S1) within the model of the conventional TGV without any stress buffer layer. FIG. 8D shows a distribution of principal stress (Si) within the model of the novel TGV structure with the top and bottom stress buffer layers.

In FIGS. 8A and 8B, the regions (A, E) correspond to nickel pads and the regions (B, D) correspond to intrusion of nickel. The region (C) corresponds to a solder via. The region (F) corresponds to copper wiring layer. The region (G) corresponds to a solder resist. The region (H) corresponds to a glass substrate. The regions (I, J) correspond to the stress buffer layers made of a polymer dielectric.

In comparison with model structure shown in the FIG. 8A, formations of three-way interface of the solder, the glass and the rigid metal (Cu, Ni) can be avoided in the novel TGV shown in FIG. 8B, by the presence of the top and bottom stress buffer layers. The rigid metal (Cu, Ni) layers are separated from the vicinity of the surfaces of the glass substrate. By comparing results shown in the FIG. 8C and FIG. 8D, it is shown that the stress buffer layer with low Young' modulus can reduce the principal stress, which would affect the brittleness of the glass substrate, at the vicinity of the surface of the glass substrate.

Hereinbelow, referring to a series of FIGS. 9-12, several variant via structures according to one or more alternative embodiment will be described.

FIG. 9 illustrates cross-sectional views of variants of the through via structure according to one or more alternative embodiments of the present invention.

FIG. 9A shows a variant structure based on the structure shown in FIG. 2A. The variant structure 100-1 may have a bump 140-1 that has merely solder ball 144-1 disposed on a pad of the metal wiring layer 124, in comparison with the structure shown in FIG. 2A.

FIG. 9B shows other variant structure based on the structure shown in FIG. 2A. In comparison with the structure shown in FIG. 2A, the variant structure 100-2 may include a polymer dielectric layer 126-2 that can be used as permanent resist for the IMS process. Also, bump 140-2 has a solder ball 144-2 disposed on a pad of the metal wiring layer 124.

FIG. 9C further shows another variant structure based on the structure shown in FIG. 2A. In comparison with the structure shown in FIG. 2A, the bump is formed by using the conductive material of the through via 130-3 just above the via hole in the variant structure 100-3.

FIG. 9D shows another variant structure based on the structure shown in FIG. 2A. In comparison with the structure shown in FIG. 9C, the variant structure 100-4 may include a stress buffer layer 122-4 that can be used as permanent resist for the IMS technology. Also the bump is formed by using the conductive material of the through via 130-4 just above the via hole.

The fabrication process for fabricating the structure shown in FIG. 9C or 9D, in the step of filling the via hole 110C, a bump may be formed above the via hole by using the conductive material at the same time as the through via 130 is formed.

FIGS. 10-12 illustrate cross-sectional views of variants of the Via structures according to one or more alternative embodiments of the present invention.

FIG. 10A shows a variant structure based on the structure shown in FIG. 2B. In comparison with the structure shown in FIG. 2B, in the variant structure 200-1, the bump is formed by using the conductive material of the through via 230-1 just above the via hole. The fabrication process for fabricating the structure shown in FIG. 10A, the bump may be formed just above the via hole by using the conductive material at the same time as the through via 230 is formed.

FIG. 10B shows another variant structure based on the structure shown in FIG. 2B. In comparison with the structure shown in FIG. 2B, in the variant structure 200-2, instead of forming the metal wiring layer 224 on the stress buffer layer 222, the bump 240-2 and the through via 230 are electrically connected through an electrode 214D-2 predefined on the substrate layer 212D.

FIG. 10C and FIG. 10D further show other variant structures based on the structure shown in FIG. 2B. FIG. 10C shows the structure prior to deposition of the polymer dielectric layer 226-3 and forming of the bump 240-3. As shown in FIG. 10C, the stress buffer layer 222-3 has a second opening aligned to a pad of an electrode 214-3, and a solder 230-3 is formed on the pad at the same time as the through via 230-3 is filled. After forming a polymer dielectric layer 226-3 over the through via 230-3 and the stress buffer layer 222-3 to form a redistribution layer 220-3, then, the bump 240-4 is formed on the pad of the electrode 214D-2 on the substrate 210 by way of the solder filled in the second opening of the stress buffer layer 222. Thus, in comparison with the structure shown in FIG. 10B, the bump 240-3 includes merely a solder.

Figure 11A:
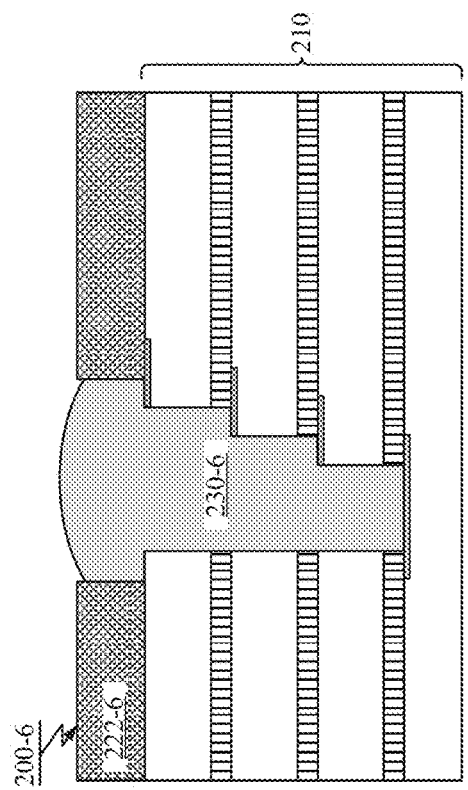
FIGS. 11A, 11B and 11C illustrate cross-sectional views of variants of the Vias structures according to one or more alternative embodiments of the present invention.
Figure 11B:
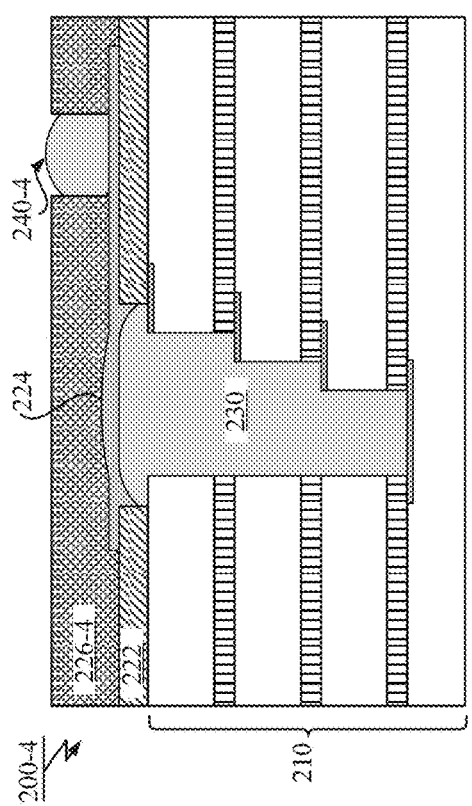
Figure 11C:
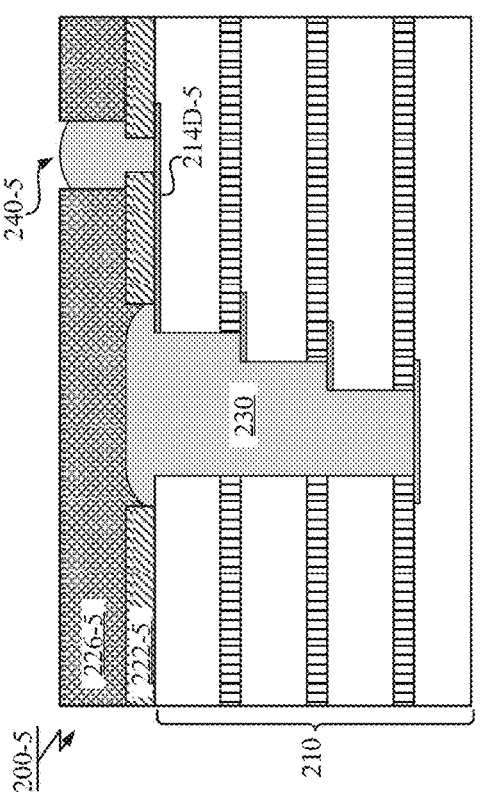

FIG. 11A, FIG. 11B and FIG. 11C show further another variant structures based on the structure shown in FIG. 2B. In comparison with the structures shown in FIG. 2B, FIG. 10D and FIG. 10A, each variant structures 200-4, 200-5 and 200-6 shown in FIG. 11A, FIG. 11B and FIG. 11C may have a respective polymer dielectric layer 226-4, 226-5 and 226-6 that can be used as permanent resist for the IMS technology.

FIG. 12A and FIG. 12B show another variant structures based on the structure shown in FIG. 2B. In comparison with the structures shown in FIG. 2B and FIG. 12A, each variant structure 200-7, 200-8 may include a back side redistribution layer 250 and the through via 230 penetrates the staked substrate 210 completely from the top surface 210A to the bottom surface 210B.

FIG. 12C and FIG. 12D show further another variant structures based on the structure shown in FIG. 2B. In comparison with the structure shown in FIG. 12A, FIG. 12B, the back side redistribution layer 250 in each variant structure 200-9, 200-10 may include the bottom stress buffer layer 252-9, 252-10. The through via 230 extends into opening of the bottom stress buffer layer 252-9, 252-10.

A fabrication process for fabricating the structure shown in FIGS. 12C and 12D, the process may include a step of forming the bottom stress buffer layer 252 on the bottom surface of the stacked substrate 210, which has an opening aligned to the via hole of the stacked substrate 210. The bottom stress buffer layer 252 may receive the conductive material extending into the opening over the level of the bottom surface 210B.

According to one or more embodiments of the present invention, in the via structures (100, 200, 300, 400), rigid material other than the conductive body (130, 230, 330, 430) can be excluded from the surface of the substrate (110, 210, 310, 410) by the stress buffer layer itself (322) and/or the conductive body (130A, 230A, 430A,B) that is intruded into the stress buffer layer (122, 222, 422), which can reduce the stress generated around the end of the conductive body (130, 230, 330, 430).

According to one or more embodiments of the present invention, also, an electronic apparatus that has the aforementioned via structure may be provided. The electronic apparatus may have one or more external electronic components such as a processor, a memory, and/or a sensor mounted thereon. The reliability of electric connection in the electronic apparatus can be improved.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, steps, layers, elements, and/or components, but do not preclude the presence or addition of one or more other features, steps, layers, elements, components and/or groups thereof.

The corresponding structures, materials, acts, and equivalents of all means or step plus function elements in the claims below, if any, are intended to include any structure, material, or act for performing the function in combination with other claimed elements as specifically claimed. The description of one or more aspects of the present invention has been presented for purposes of illustration and description, but is not intended to be exhaustive or limited to the invention in the form disclosed.

Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for fabricating a via structure, the method comprising:
   preparing a substrate having a top surface and a bottom surface opposite the top surface;
   fabricating a via hole in the substrate from the top surface of the substrate to the bottom surface of the substrate;
   disposing a stress buffer layer on the top surface of the substrate, the stress buffer layer having an opening aligned to the via hole of the substrate; and
   filling the via hole with a conductive material from the bottom surface of the substrate at least up to the top surface of the substrate, the stress buffer layer reducing stress generated due to coefficient of thermal expansion mismatch associated with the via hole and the substrate;
   wherein the conductive material extends into the opening above the top surface of the substrate and/or covers, at least in part, an edge of the top surface of the substrate around the via hole.

2. The method of claim 1, wherein the method further comprises:
   disposing a metal material on the stress buffer layer and the conductive material; and
   disposing a polymer dielectric layer over the metal material to form a redistribution layer on the substrate, the redistribution layer being composed of the stress buffer layer, the metal material and the polymer dielectric layer.

3. The method of claim 2, wherein the method further comprises:
   forming a bump on the metal material, the bump including a metal post and/or a solder, the bump being electrically connected with the conductive material filled in the via hole through the metal material.

4. The method of claim 1, wherein the filling further comprises:
   forming a bump by using the conductive material above the via hole.

5. The method of claim 1, wherein the substrate has a pad wiring to the via hole on the first surface and the stress buffer layer has a second opening aligned to the pad on the substrate, the method further comprising:
   disposing a polymer dielectric layer over the conductive material filled in the via hole and the stress buffer layer to form a redistribution layer on the substrate, the redistribution layer being composed of the stress buffer layer and the polymer dielectric layer;
   forming a hump on the pad of the substrate, the bump being electrically connected with the conductive material filled in the via hole through the pad.

6. The method of claim 5, wherein the filling comprises filling the second opening with the conductive material, the forming comprises forming the bump by way of the conductive material filled in the second opening.

7. The method of claim 1, wherein the substrate has further a second surface, the via hole is a through hole penetrating through the substrate from the first surface to the second surface, and the method further comprises:
   forming a second stress buffer layer on the second surface of the substrate, the second stress buffer layer having an opening aligned to the via hole of the substrate;
   wherein the second stress buffer layer receives the conductive material extending into the opening over the level of the second surface of the substrate and/or covers, at least in part, the edge of the second surface around the via hole of the substrate.

8. The method of claim 1, wherein the substrate is made of a glass or silicon, the stress buffer layer is made of polymer dielectric and the filling comprises:
   filling the via hole with a solder by Injection Molded Solder (IMS) technology.

9. The method of claim 1, wherein the preparing comprises:
   stacking a plurality of substrate layers as the substrate; and
   penetrating through at least one of the substrate layers from the first surface to form the via hole of the substrate.

10. A method for fabricating a via structure, the method comprising:

preparing a substrate having a top surface and a bottom surface opposite the top surface, a via hole in the substrate from the top surface of the substrate to the bottom surface of the substrate, and a stress buffer layer disposed on the top surface of the substrate, the stress buffer layer having an opening aligned to the via hole and reducing stress generated due to coefficient of thermal expansion mismatch associated with the via hole and the substrate; and forming, in the via hole, a conductive body having a protrusion part extending into the opening of the stress buffer layer above the top surface of the substrate.

11. The method of claim 10, wherein the method further comprises:

disposing a metal material on the stress buffer layer and the conductive body; and disposing a polymer dielectric layer over the metal material to form a redistribution layer on the substrate, the redistribution layer being composed of the stress buffer layer, the metal material and the polymer dielectric layer.

12. The method of claim 2, further comprising forming a second redistribution layer on the bottom surface of the substrate.

13. The method of claim 12, wherein forming the second redistribution layer further comprises disposing a metal material on the bottom surface of the substrate.

14. The method of claim 13, wherein forming the second redistribution layer further comprises disposing a polymer dielectric material on the metal material.

15. The method of claim 11, wherein the method further comprises:

forming a bump on the metal material, the bump including a metal post and/or a solder, the bump being electrically connected with the conductive material filled in the via hole through the metal material.

16. The method of claim 11, further comprising forming a second redistribution layer on the bottom surface of the substrate.

17. The method of claim 16, wherein forming the second redistribution layer further comprises disposing a metal material on the bottom surface of the substrate.

18. The method of claim 16, wherein forming the second redistribution layer further comprises disposing a polymer dielectric material on the metal material.

* * * * *